(12) United States Patent
Bhalla et al.

(10) Patent No.: US 9,478,646 B2
(45) Date of Patent: Oct. 25, 2016

(54) METHODS FOR FABRICATING ANODE SHORTED FIELD STOP INSULATED GATE BIPOLAR TRANSISTOR

(75) Inventors: Anup Bhalla, Santa Clara, CA (US);
Madhur Bobde, Sunnyvale, CA (US);
Yongping Ding, Sunnyvale, CA (US);
Xiaotian Zhang, San Jose, CA (US);
Yueh-Se Ho, Sunnyvale, CA (US)

(73) Assignee: ALPHA AND OMEGA SEMICONDUCTOR INCORPORATED, Sunnyvale, CA (US)

(*) Notice: Subject to any disclaimer, the term of this patent is extended or adjusted under 35 U.S.C. 154(b) by 954 days.

(21) Appl. No.: 13/192,385

(22) Filed: Jul. 27, 2011

(65) Prior Publication Data

US 2013/0029461 A1   Jan. 31, 2013

(51) Int. Cl.
*H01L 29/739* (2006.01)
*H01L 29/66* (2006.01)
*H01L 29/06* (2006.01)
*H01L 29/08* (2006.01)

(52) U.S. Cl.
CPC ....... *H01L 29/7395* (2013.01); *H01L 29/0661* (2013.01); *H01L 29/0834* (2013.01); *H01L 29/66333* (2013.01)

(58) Field of Classification Search
CPC ........... H01L 29/7393; H01L 29/7395; H01L 29/66333; H01L 29/0834
USPC ................... 438/138, 135; 257/E21.383
See application file for complete search history.

(56) References Cited

U.S. PATENT DOCUMENTS

| | | | |
|---|---|---|---|
| 4,450,467 A | 5/1984 | Nagano et al. | |
| 5,156,981 A * | 10/1992 | Kitagawa et al. | 438/133 |
| 5,286,655 A | 2/1994 | Tsunoda | |
| 5,360,984 A | 11/1994 | Kirihata | |
| 7,112,868 B2 | 9/2006 | Willmeroth et al. | |
| 7,132,321 B2 * | 11/2006 | Kub et al. | 257/E21.383 |
| 7,250,639 B1 * | 7/2007 | Suekawa | 257/133 |
| 7,456,484 B2 | 11/2008 | Ozeki et al. | |
| 7,498,634 B2 | 3/2009 | Tsuzuki et al. | |
| 8,242,536 B2 | 8/2012 | Tanabe et al. | |
| 8,299,539 B2 | 10/2012 | Kouno | |
| 8,378,427 B2 | 2/2013 | Chen | |
| 2001/0040255 A1 * | 11/2001 | Tanaka | 257/342 |
| 2008/0090391 A1 * | 4/2008 | Tsuchitani et al. | 438/513 |
| 2012/0025261 A1 * | 2/2012 | Bobde | H01L 29/0839 257/139 |

FOREIGN PATENT DOCUMENTS

JP        2002190596 A  *  7/2002

* cited by examiner

*Primary Examiner* — Stephen W Smoot
*Assistant Examiner* — Sun M Kim
(74) *Attorney, Agent, or Firm* — Joshua D. Isenberg; JDI Patent

(57) ABSTRACT

A method for fabricating an anode-shorted field stop insulated gate bipolar transistor (IGBT) comprises selectively forming first and second semiconductor implant regions of opposite conductivity types. A field stop layer of a second conductivity type can be grown onto or implanted into the substrate. An epitaxial layer can be grown on the substrate or on the field stop layer. One or more insulated gate bipolar transistors (IGBT) component cells are formed within the epitaxial layer.

9 Claims, 18 Drawing Sheets

METHODS FOR FABRICATING ANODE SHORTED FIELD STOP INSULATED GATE BIPOLAR TRANSISTOR

FIELD OF THE INVENTION

This invention relates to methods for fabricating an anode-shorted field stop insulated gate bipolar transistor (IGBT).

BACKGROUND OF THE INVENTION

Insulated gate bipolar transistors (IGBT) are three-terminal power semiconductor devices. The IGBT combines the simple gate-driven characteristics of a metal-oxide-semiconductor field effect transistor (MOSFET) with the high current, low saturation voltage capability of bipolar transistors. This is accomplished by combining an isolated gate FET, which serves as the control input of the IGBT, with a bipolar transistor, which serves as the switch for the IGBT, in a single device.

FIG. 1A is a cross-sectional schematic diagram illustrating a conventional IGBT according to the prior art. A conventional IGBT comprises a field stop layer 103 of n-type supported by a p+ substrate 101. An n− epitaxial/voltage blocking layer 105 is grown on top of the field stop layer 103. One or more cells can be formed with the epitaxial/voltage blocking layer 105. Each cell may include a p-type body region 107 formed within the epitaxial/voltage blocking layer 105 and one or more n+ emitter regions 109 formed within the p-type body region 107. Each cell may further include gate electrode insulator 111 (e.g., an oxide) formed on an exposed part of the p-type body region 107 and n+ emitter regions 109. A gate electrode 113 is formed on the gate insulator 111. Emitter electrodes 115 are formed on different portions of the body region 107 and emitter region 109. A collector electrode 117 can be formed on a back surface of the p+ substrate 101. The IGBT 100 is constructed similarly to an n-channel vertical MOSFET, except that the n+ drain is replaced with a p+ collector layer 101, thus forming a vertical PNP bipolar junction transistor. The additional p+ collector layer 101 creates a cascade connection of a PNP bipolar junction transistor with the surface n-channel MOSFET.

The IGBT provides more optimal performance in certain applications over a conventional MOSFET device. This is mainly due to the fact that the IGBT exhibits a significantly lower forward voltage drop in comparison to the MOSFET. However, the increase in forward voltage drop is off-set by the slow switching speeds of the IGBT device. Minority carriers that are injected into the n− epitaxial/voltage blocking layer 105 take time to enter and exit or recombine at turn on and turn off, resulting in longer switching times and higher switching losses in comparison to the MOSFET.

In response to the slow switching speeds of conventional IGBT devices, anode-shorted IGBT devices have been developed. The anode-shorted IGBT is superior to the conventional IGBT in that it exhibits more desirable switching characteristics while retaining the improved forward voltage drop. FIG. 1B is a cross-sectional schematic diagram illustrating a conventional anode-shorted IGBT in accordance with the prior art. The anode-shorted IGBT 100' shown in FIG. 1B is essentially the same as the IGBT in FIG. 1A, except that the p+ substrate 101 in FIG. 1A is replaced by a layer consisting of alternating p-type regions 101 and n-type regions 119 in FIG. 1B. By alternating p-regions 101 and n-type regions 119 the IGBT is effectively provided an additional body diode as well as improved switching speeds.

Embodiments of the present invention relate to methods for fabricating such an anode-shorted insulated gate bipolar transistor (IGBT).

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the embodiments of the invention described below are set forth without any loss of generality to, and without imposing limitations upon, the claimed invention.

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

For convenience, use of + or − after a designation of conductivity or charge carrier type (p or n) refers generally to a relative degree of concentration of designated type of charge carriers within a semiconductor material. In general terms an n+ material has a higher negative charge carrier (e.g., electron) concentration than an n material and an n material has a higher carrier concentration than an n− material. Similarly, a p+ material has a higher positive charge carrier (e.g., hole) concentration than a p material and a p material has a higher concentration than a p– material. It is noted that what is relevant is the concentration of charge carriers, not necessarily dopants. For example, a material may be heavily doped with n-type dopants but still have a relatively low charge carrier concentration if the material is also sufficiently counter-doped with p-type dopants. As used herein, a concentration of dopants less than about $10^{16}/cm^3$ may be regarded as "lightly doped" and a concentration of dopants greater than about $10^{17}/cm^3$ may be regarded as "heavily doped".

Figure 2A:
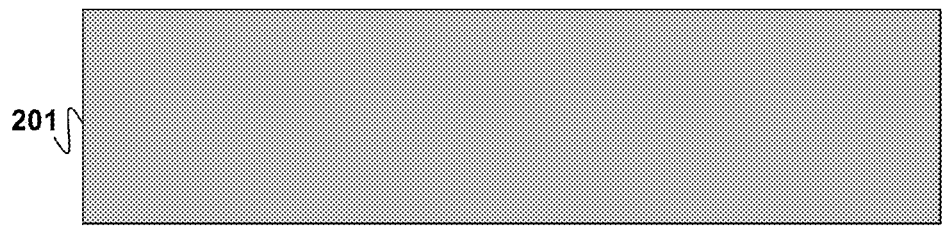
FIGS. 2A-2H are cross-sectional schematic diagrams illustrating a method for manufacturing an anode-shorted field stop insulated gate bipolar transistor (IGBT) according to an embodiment of the present invention.
Figure 2B:
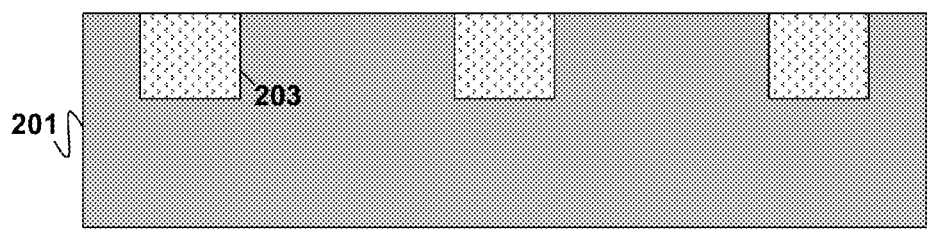

FIGS. 2A-2H are cross-sectional schematic diagrams illustrating a method for manufacturing an anode-shorted field stop insulated bipolar transistor (IGBT) according to an embodiment of the present invention. The fabrication method begins with a lightly doped p– substrate 201 as shown in FIG. 2A. A masked implant (mask not shown) is performed on the top surface of the substrate 201 in order to selectively form a plurality of first semiconductor regions 203 of a first conductivity type within a top surface of the substrate 201 as shown in FIG. 2B. By way of example, and not by way of limitation, the first conductivity type may be n+. The first semiconductor regions 203 may then be diffused to a desired depth. In some applications, it is preferable to diffuse the first semiconductor regions to a depth of at least 10 μm. In other applications, a width of the first semiconductor regions may be much smaller than a space between adjacent first semiconductor regions to minimize any snapback issues of the finished device.

Figure 2C:
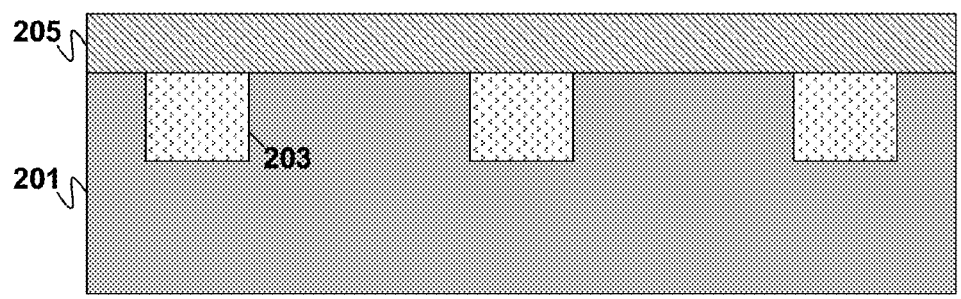
Figure 2D:
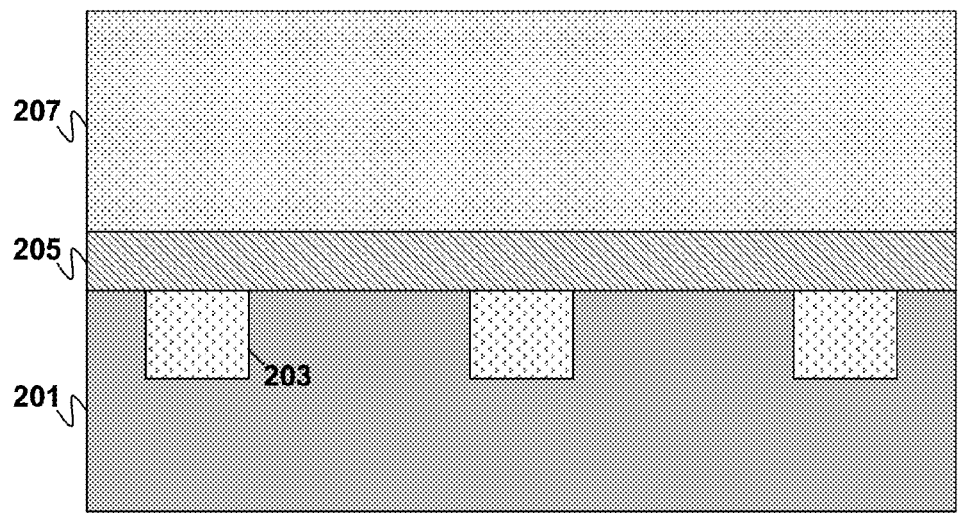

After the one or more first semiconductor regions 203 have been formed, a field stop layer 205 of the first conductivity type may be grown onto the top surface of the substrate 201 as shown in FIG. 2C. The field stop layer 205 may have a lower concentration of charge carriers than the first semiconductor regions 203. By way of example, and not by way of limitation, the field stop layer 205 may be n type doped. An epitaxial/voltage blocking layer 207 of the first conductivity type may then be grown on top of the field stop layer 205 as illustrated in FIG. 2D. The voltage blocking layer 207 may have a lower concentration of charge carriers than the field stop layer 205.

Figure 1A:
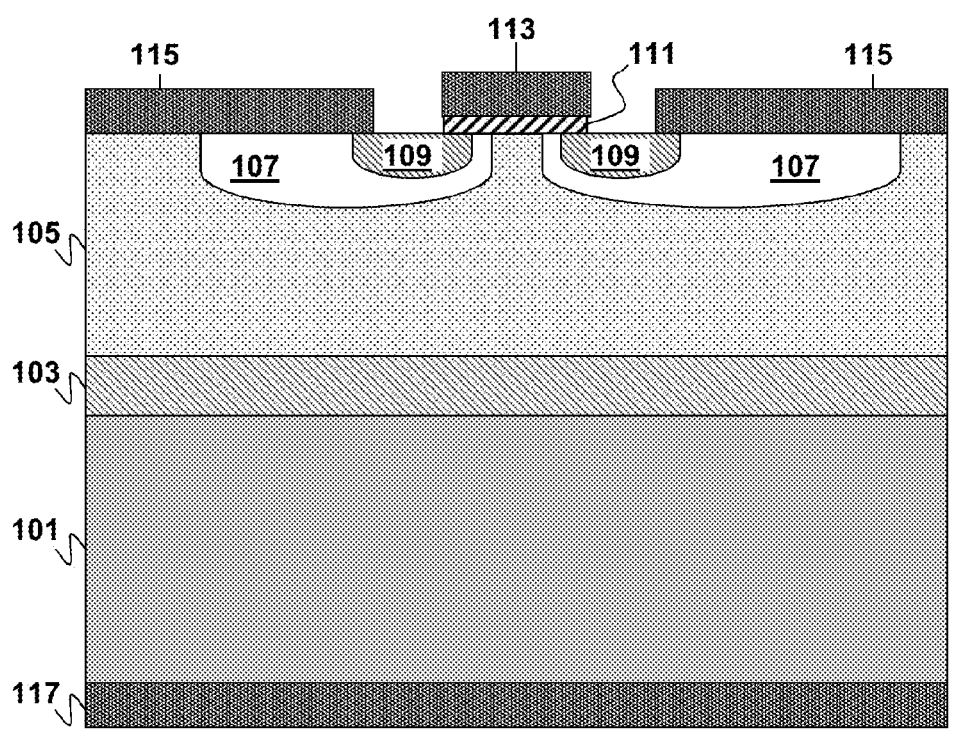
FIG. 1A is a cross-sectional schematic diagram illustrating a conventional insulated gate bipolar transistor (IGBT) according to the prior art.
Figure 1B:
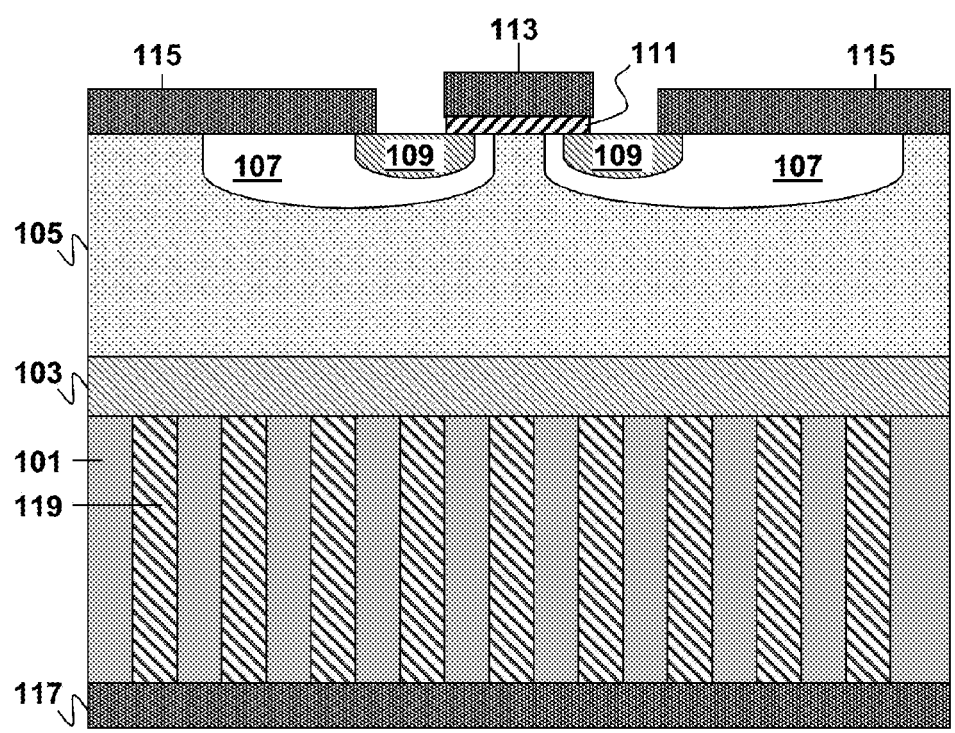
FIG. 1B is a cross-sectional schematic diagram illustrating a conventional anode-shorted insulated gate bipolar transistor (IGBT) according to the prior art.
Figure 2E:
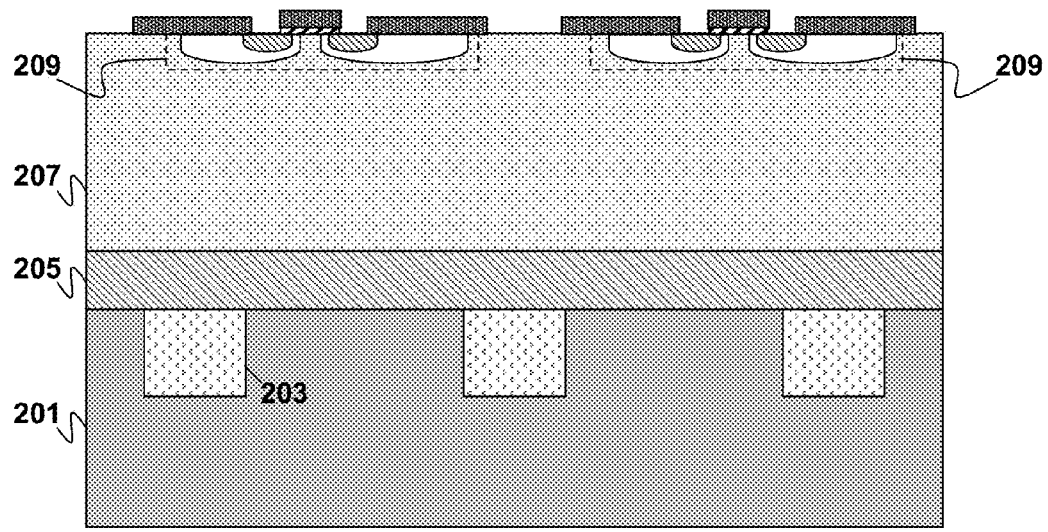

One or more IGBT component cells 209 may then be formed on a top portion within the epitaxial/voltage blocking layer 207 as shown in FIG. 2E. The term "IGBT component cell" as defined herein will refer to a cell that includes a body region, one or more emitter regions, a gate electrode, one or more corresponding emitter electrodes, and insulating layers. While an IGBT component cell must include those particular components, one ordinarily skilled in the art will recognize that several different configurations may exist for implementing those IGBT components. For example, the IGBT in FIG. 1A illustrates one possible configuration for implementing an IGBT component cell including emitter regions formed within body regions and an insulated gate. The IGBT component cells 209 formed within the epitaxial/voltage blocking layer 207 may be any configuration so long as they comprise the components discussed above and retain their functionality.

Figure 2F:
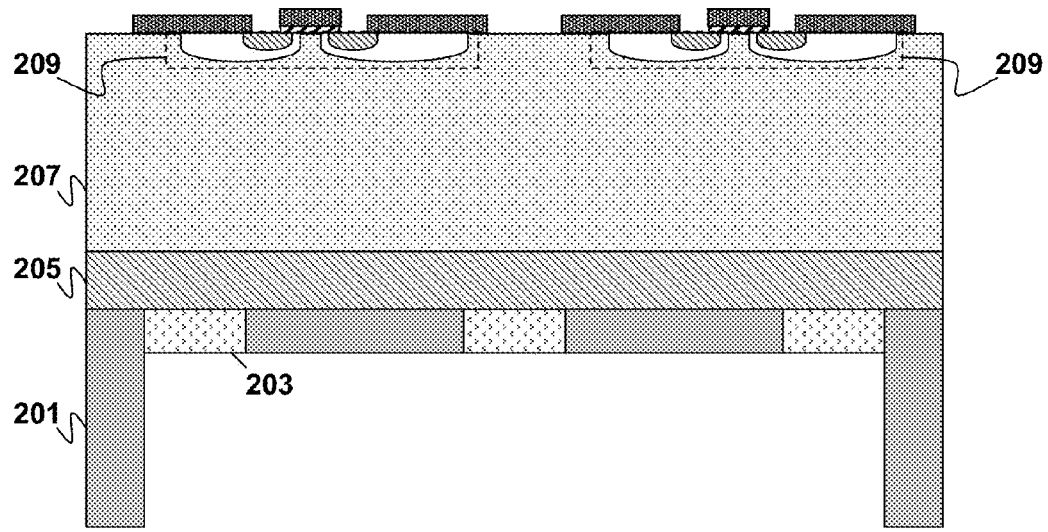

The back surface of the substrate 201 is then thinned, e.g., by Taiko grinding, to a desired thickness such that the first semiconductor regions 203 are exposed as shown in FIG. 2F. The term "Taiko grinding" as used herein refers to a process of grinding an inner surface of a wafer while leaving an outer edge on the outermost circumference untouched. This method reduces the risk of thin wafer handling and lowers warping of the wafer during device processing. For certain applications, it is desirable to grind the back surface of the substrate 201 to a thickness of 5 μm an below the field stop layer 205.

Figure 2G:
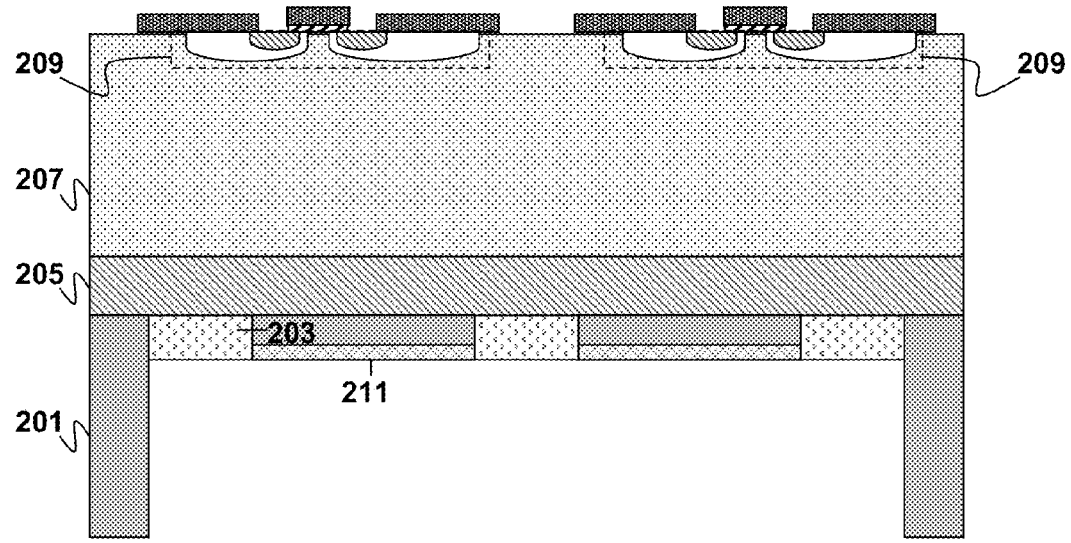

A blanket implant of a second conductivity type is then performed on the back surface of the substrate 201, resulting in implant regions 211 being formed within the back surface of the substrate 201 as shown in FIG. 2G. By way of example, and not by way of limitation, the implant regions may be doped p+ type. Also by way of example, and not by way of limitation, the blanket implant may be a Boron implant with a doping concentration of $1\times10^{16}$ $cm^{-3}$ performed at an energy level of 40 KeV. The blanket implant is limited to minimal activation because the high temperatures (typically 900-1000 degree C. for 30 minutes) required to fully activate the implant regions 211 would destroy the IGBT cells 209. Because of the limited activation of the blanket implant, the first semiconductor regions 203 are unaffected by the p+ implant.

Figure 2H:
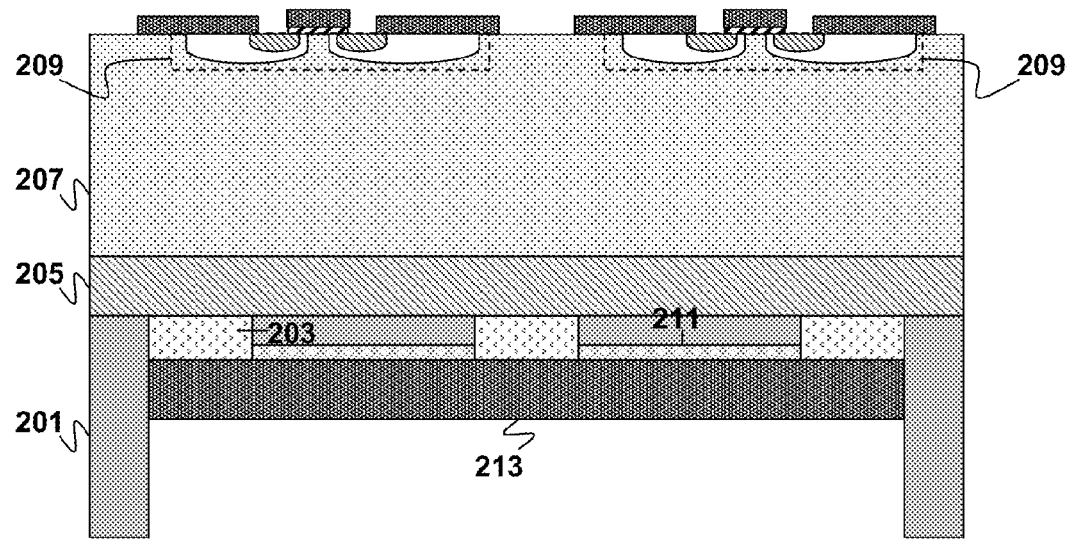

Lastly, metal 213 may be evaporated onto the back surface of the substrate 201 to form the collector electrode of the IGBT as shown in FIG. 2H. This process may be performed at 450° C. thereby partially activating the implant regions 211. The resulting structure is an anode-shorted field stop IGBT, with alternating p regions 201, 211 and n regions 203 forming the anode short circuit.

In this embodiment, the p+ regions 211 are implanted from the back at the end of the process, allowing accurate control of the injection efficiency of the IGBT without compromise to the IGBT field stop characteristics of positive temperature coefficient, fast switch without lifetime control and no increase in turn off energy $E_{off}$ with temperature. Further the p+ implant is carried out without a mask. This allows the wafer to be ground to a much thinner degree to reduce on resistance compare to the existing technology that uses masking process simply because masking would be difficult on a thin wafer.

Figure 3A:
FIGS. 3A-3F are cross-sectional schematic diagrams illustrating a method for manufacturing an anode-shorted field stop insulated gate bipolar transistor (IGBT) according to an alternative embodiment of the present invention.
Figure 3B:
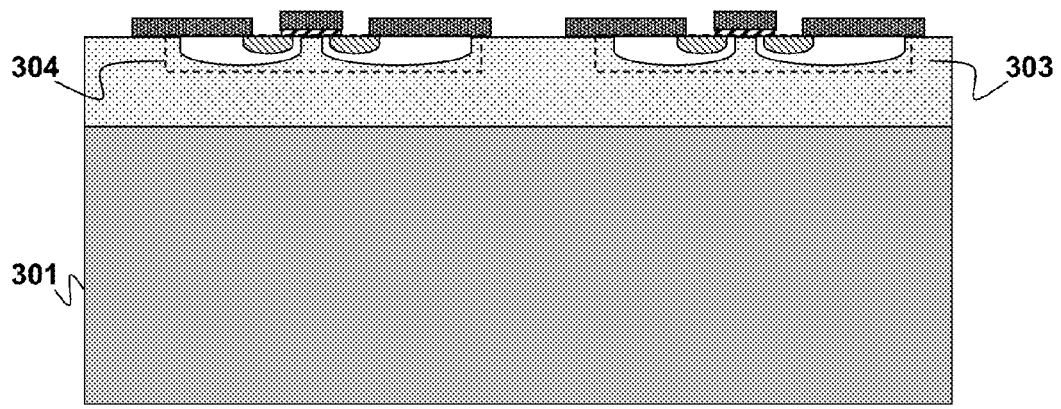

FIGS. 3A-3F are cross-sectional schematic diagrams illustrating a method for manufacturing an anode-shorted field stop insulated gate bipolar transistor (IGBT) according to an alternative embodiment of the present invention. The fabrication method begins with an epitaxial/voltage blocking layer 303 that is formed on a very lightly doped substrate 301. The substrate and epitaxial layer may be doped with opposite conductivity types. By way of example, and not by way of limitation, the blocking layer 303 may be doped to be n– type and the substrate 301 may be doped p– type. One or more IGBT component cells 304 may then be formed within the epitaxial/voltage blocking layer 303 as shown in FIG. 3B. As noted above, the term "IGBT component cell" refers to a cell that includes a body region, one or more emitter regions, a gate electrode, one or more corresponding emitter electrodes, and insulating layers in any suitable/functional configuration, such as that shown in FIG. 1A.

Figure 3C:
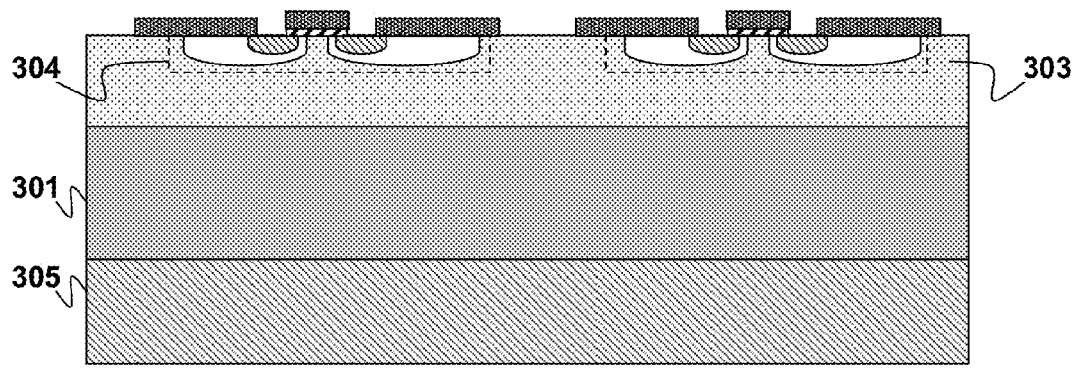

The substrate 301 may be thinned, e.g., by grinding, to a desired thickness. A blanket implant of a the first conductivity type may then be performed to the back surface of the epitaxial/voltage blocking layer 301 to form a field stop layer 305 as shown in FIG. 3C. The field stop layer 305 may have a higher concentration of charge carriers than the blocking layer 301. By way of example, and not by way of limitation, the field stop layer 305 may be doped to be n type. Also by way of example and not by way of limitation, the blanket implant may be a Phosphorous implant with a doping concentration of $1\text{-}2\times10^{13}$ $cm^{-3}$ performed at an energy level ranging between 100-300 KeV.

Figure 3D:
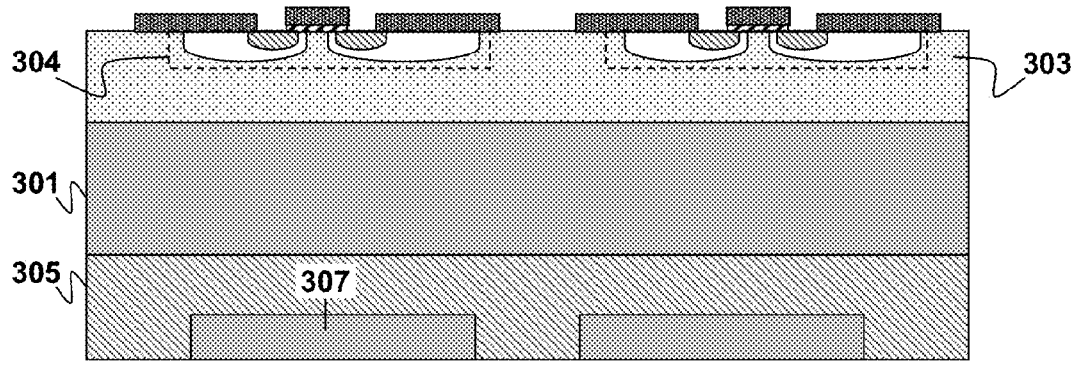

A first shadow-masked (mask not shown) implant is then performed on a back surface of the field stop layer 305 to selectively form one or more first semiconductor regions 307 of a second conductivity type within the back surface of the field stop layer 305 as shown in FIG. 3D. The term "shadow mask" refers to a metal mask with patterned holes that may directly contact a wafer or may be remotely positioned in proximity to the wafer in order to form a desired pattern within or on top of the wafer. By way of example, and not by way of limitation, the first semiconductor regions 307 may be p+ type doped. Also by way of example, and not by way of limitation, the first shadow-masked implant may be a Boron implant with a doping concentration of $1 \times 10^{16}$ cm$^{-3}$ performed at an energy level of 40 KeV.

Figure 3E:
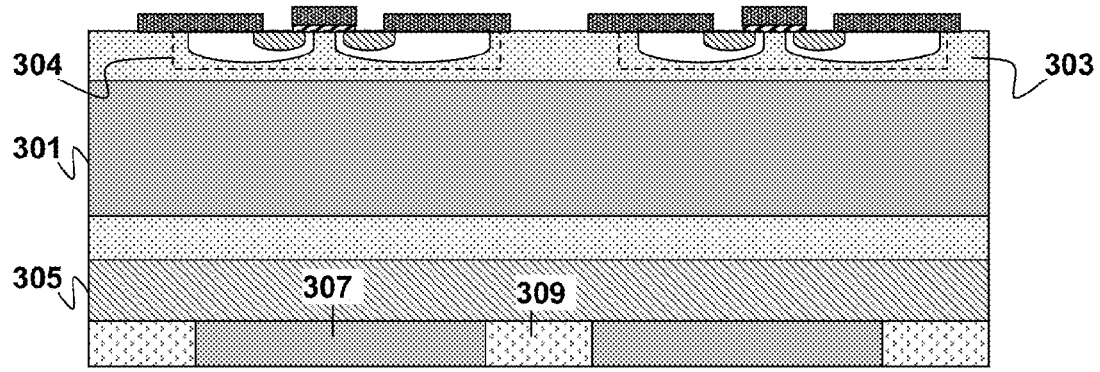

A second shadow-masked (mask not shown) implant is then performed on the back surface of the field stop layer 305 to selectively form one or more second semiconductor regions 309 of the first conductivity type within the back surface of the field stop layer 305 as shown in FIG. 3E. The second semiconductor regions 309 may be doped more heavily than the blocking layer 301 and field stop layer 305. By way of example and not by way of limitation, the second semiconductor regions 309 may be n+ type doped. Also by way of example and not by way of limitation, the second shadow-masked implant may be a Phosphorous implant with a doping concentration of $1 \times 10^{16}$ cm$^{-3}$ performed at an energy level of 40 KeV. The first semiconductor regions and the second semiconductor regions may then be laser activated. Laser activation is a process that involves directing a high-energy laser pulse at a desired location. Because of its short duration, the laser pulse activates the dopants without reaching the front surface of the device structure and damaging the IGBT component cells 303.

Figure 3F:
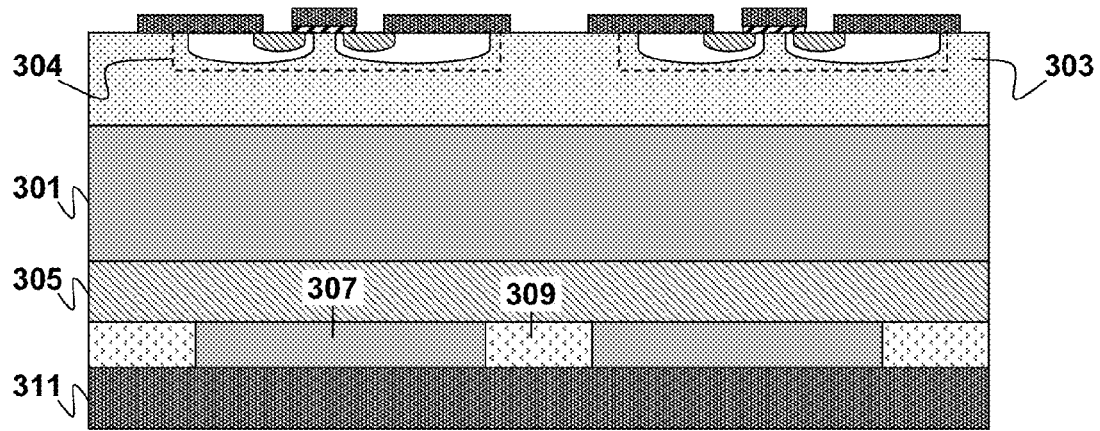

Lastly, metal 311 may be deposited onto the back surface of the first and second semiconductor regions 307, 309 to form the collector electrode of the IGBT as shown in FIG. 3F. By way of example and not by way of limitation, the metal 311 may be an aluminum-tin-nickel-silver (Al—Ti—Ni—Ag) alloy. The resulting structure is an anode-shorted field stop IGBT, with alternating p regions 307 and n regions 309 forming the anode short circuit. The use of two masks avoids counter-doping the heavy doped regions as described in process shown in FIG. 2G. In one embodiment the first shadow mask and the second shadow mask are complementary. In another embodiment a width of the semiconductor regions of the second conductivity type 307 is much larger than a width of the semiconductor regions of the first conductivity type 309.

Figure 4A:
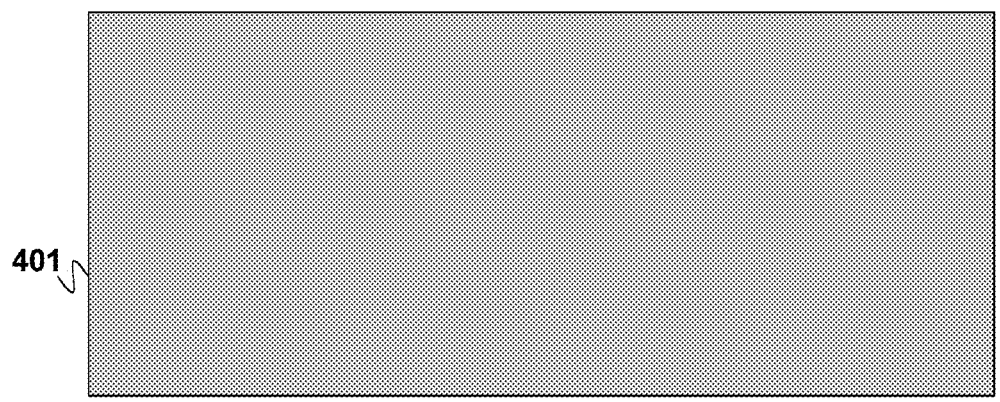
FIGS. 4A-4H are cross-sectional schematic diagrams illustrating a method for manufacturing an anode-shorted field stop insulated gate bipolar transistor (IGBT) according to another alternative embodiment of the present invention.
Figure 4B:
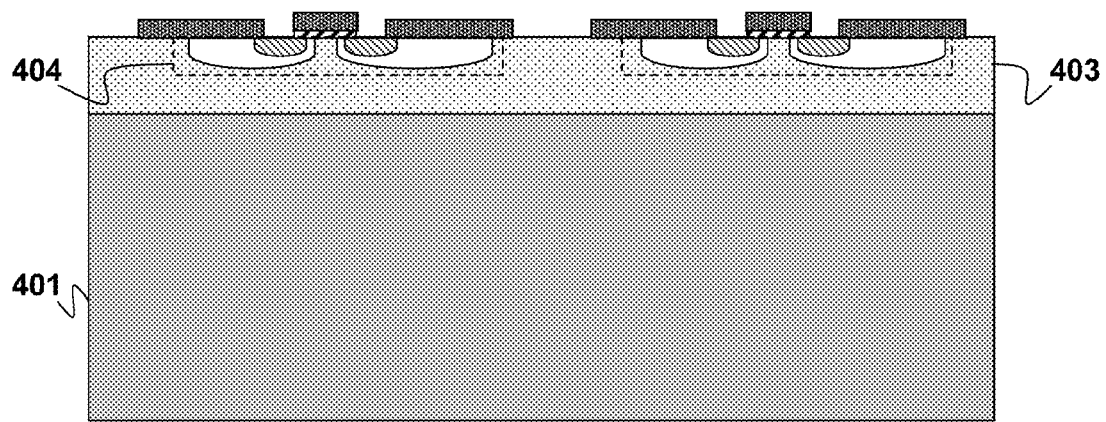

FIGS. 4A-4H are cross-sectional schematic diagrams illustrating a method for manufacturing an anode-shorted field stop insulated gate bipolar transistor (IGBT) according to another alternative embodiment of the present invention. The fabrication method begins with an epitaxial/voltage blocking layer 403 formed on a substrate 401 as shown in FIG. 4A. The substrate and epitaxial layer may be of the same conductivity type but with different concentrations of charge carriers. By way of example, and not by way of limitation, the substrate 401 may be n+ type and the epitaxial layer 403 may be n-type. One or more IGBT component cells 404 may then be formed the epitaxial/voltage blocking layer 403 as shown in FIG. 4B. As noted above, the term "IGBT component cell" refers to a cell that includes a body region, one or more emitter regions, a gate electrode, one or more corresponding emitter electrodes, and insulating layers in any suitable/functional configuration.

Figure 4C:
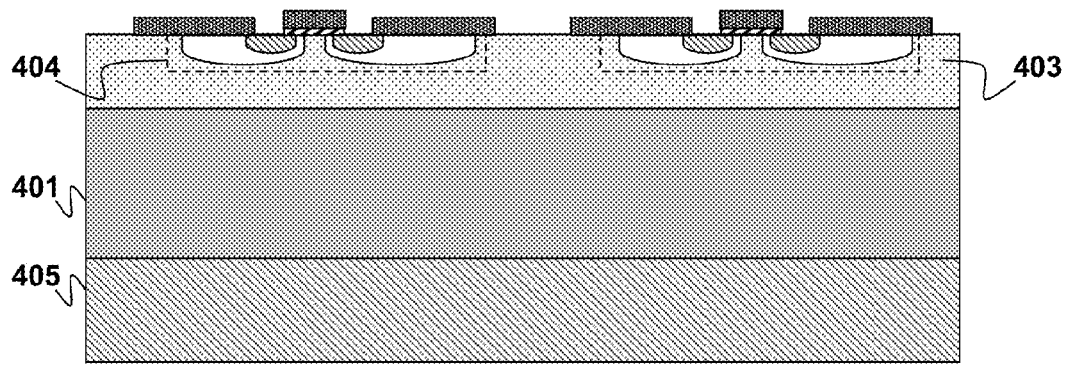

The back surface of the epitaxial/voltage blocking layer 401 is then thinned, e.g. by Taiko grinding, to a desired thickness. As discussed above, the term "Taiko grinding" refers to a process of grinding an inner surface of a wafer while an outer edge on the outermost circumference remains untouched (not shown). A blanket implant of the first conductivity type is then performed to the back surface of the substrate 401 to form a field stop layer 405 as shown in FIG. 4C. The field stop layer 405 may have a higher concentration of charge carriers than the blocking layer 403 and a lower concentration of charge carriers than the substrate 401. By way of example, and not by way of limitation, the field stop layer 405 may be n type doped if the substrate 401 is n+ doped and the blocking layer 403 is n− doped. Also by way of example and not by way of limitation, the blanket implant may be a phosphorous implant with a doping concentration of $1-2 \times 10^{13}$ cm$^{-3}$ performed at staggered energies ranging up to 1 MeV in order to achieve a field stop layer 405 of several microns.

Figure 4D:
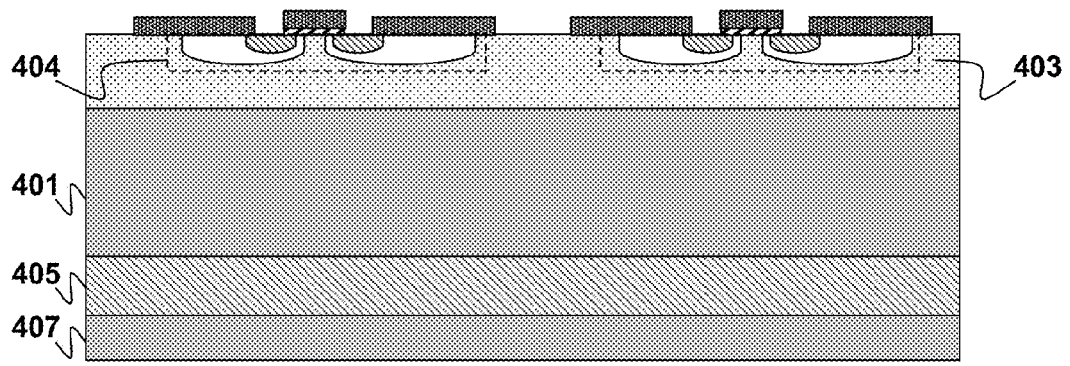

A blanket implant of the second conductivity type is performed to a back surface of the field stop layer 405 in order to form a first implant layer 407 of the second conductivity type within the back surface of the field stop layer 405 as shown in FIG. 4D. By way of example, and not by way of limitation, the first implant layer 407 may be p+ doped. Also by way of example and not by way of limitation, the blanket implant may be a boron implant with a doping concentration of $1 \times 10^{16}$ cm$^{-3}$ performed at an energy level of 40 KeV.

The dopants in the first implant layer 407 and field stop layer 405 may then be laser activated. As noted above, laser activation is a process that involves directing a high-energy laser pulse at a desired location. Because of their short duration, laser pulses do not penetrate into the front surfaces of the device structure.

Figure 4E:
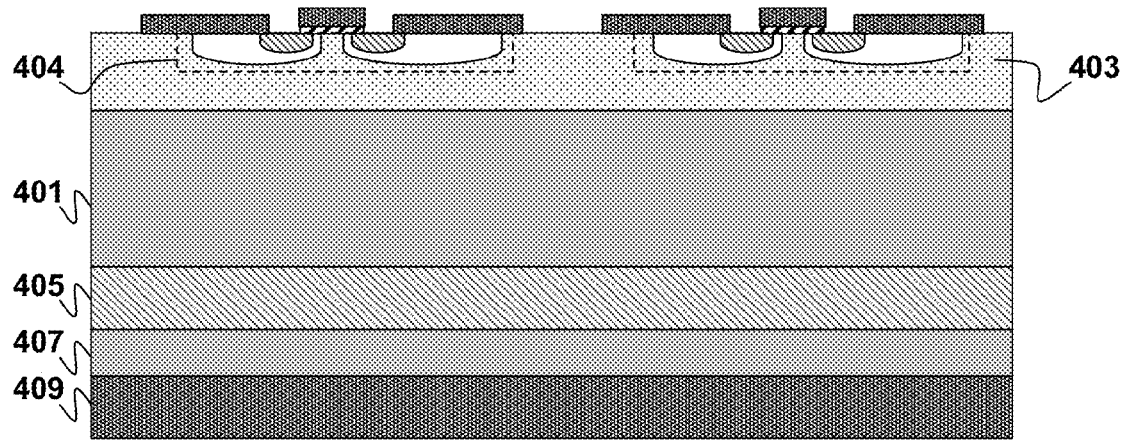
Figure 4F:
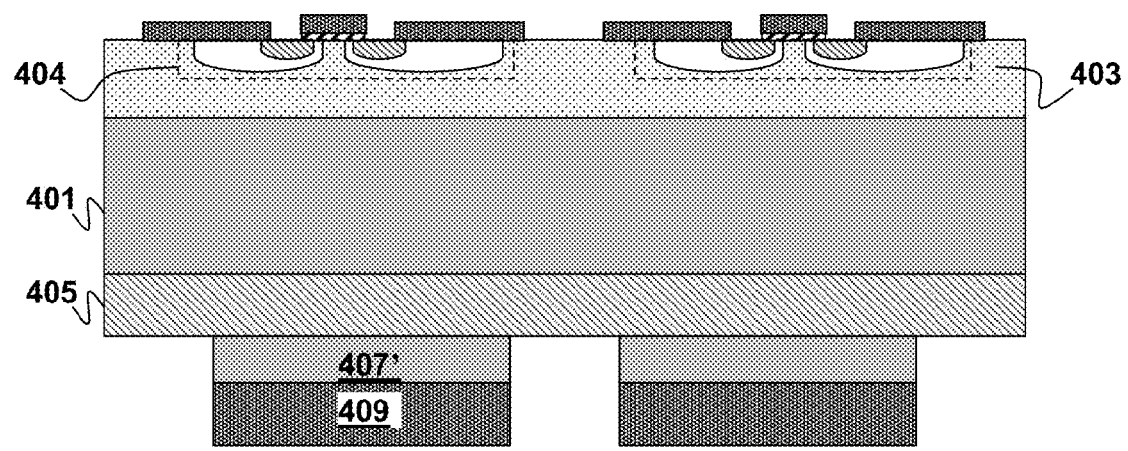

After the first implant layer 407 and field stop layer 405 have been laser activated, a first metal layer 409 (e.g., an aluminum layer of 5000 Å) is deposited onto a backside of the first semiconductor layer 407 as shown in FIG. 4E. Isolated implant regions 407' may then be selectively formed by laser cutting one or more portions of the first metal layer 409 and first semiconductor layer 407 such that one or more portions of the field stop layer 405 are exposed as shown in FIG. 4F.

Figure 4G:
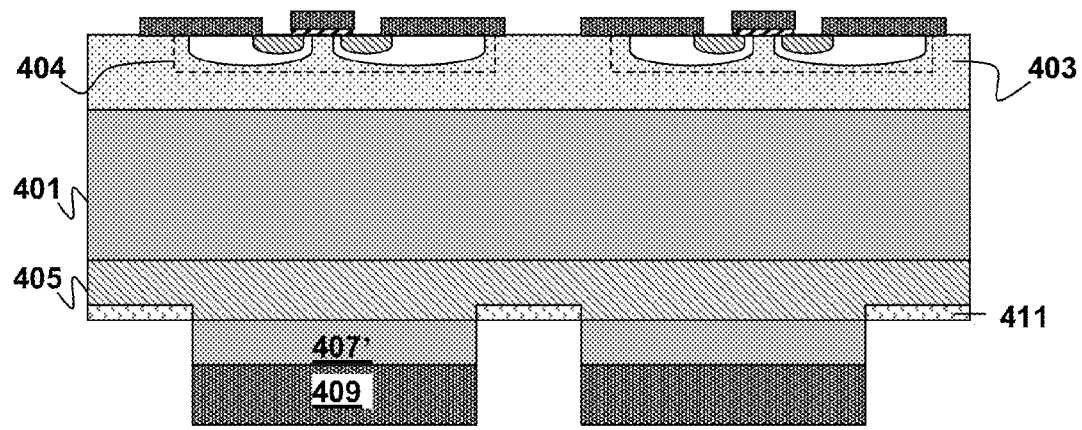
Figure 4H:
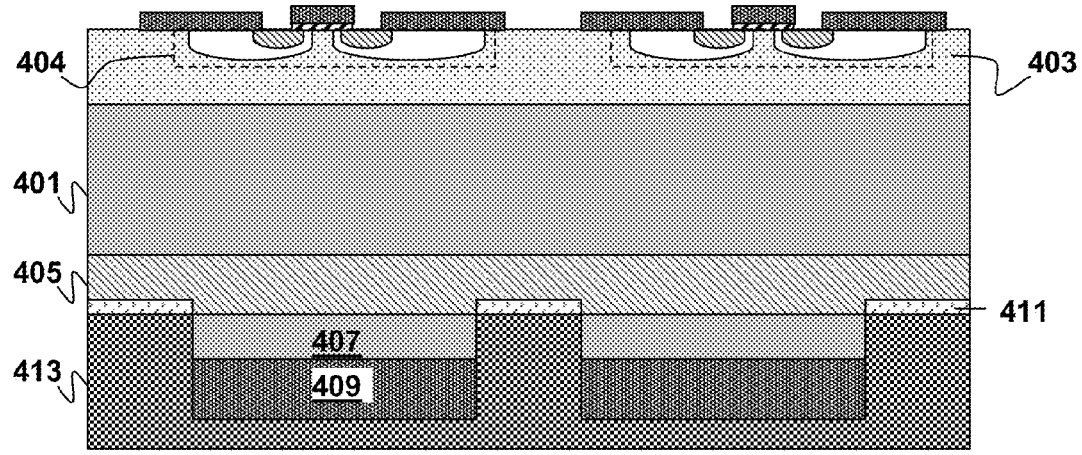

A blanket implant of dopants of the first conductivity type is then performed to the exposed portions of the field stop layer 405 using the patterned first metal layer 409 as a mask in order to form second implant regions 411 within exposed portions of the field stop layer 405 between isolated implant regions 407' as shown in FIG. 4G. The isolated implant regions 407' are shielded from exposure to the blanket implant by the first metal layer 409. The second semiconductor regions 411 may be doped to have a higher concentration of charge carriers than the blocking layer 403 and the field stop layer 405. By way of example, and not by way of limitation, the second implant regions 411 may be doped n+ type if the blocking layer is doped n− and the field stop layer is doped n type. Also by way of example and not by way of limitation the blanket implant may be a phosphorous implant with a doping concentration of $1 \times 10^{16}$ cm$^{-3}$ performed at an energy level of 40 KeV. A second metal layer 413 may then be deposited over the first and second semiconductor regions 407' and 411 as shown in FIG. 4H. By way of example, and not by way of limitation, the second metal layer 413 may be a titanium-nickel-silver (Ti—Ni—Ag) alloy. Prior to depositing the second metal layer 413 a sputter etch may be performed on the second metal layer 409 to remove any oxide formed on the first metal layer 409 due to exposure to the external environment. The second metal layer 413 and first metal layer 409 collectively form the collector electrode of the IGBT device. The resulting structure is an anode-shorted field stop IGBT, with alternating p implant regions 407' and n implant regions 405 forming the anode short circuit.

The metal layers 409 and 413 can be different types of metals specifically chosen for their ability to make good contact with the differently doped implant regions 407', 411. For example first the implant regions 407' may be doped p+ type and the second implant regions 411 may be doped n type or n+ type. Aluminum makes good contact to p type regions and titanium makes good contact to n type or n+ type regions. In such a case, the first metal layer 409 may be Aluminum and the second metal layer 413 may be Titanium. The resulting structure provides good electrical contact to both implant regions 407', 411. In addition, cutting an aluminum layer into pieces during the patterning process may reduce stress due to the differences in coefficient of thermal expansion (CTE) between Al and the underlying substrate material (e.g., Silicon).

Figure 5A:
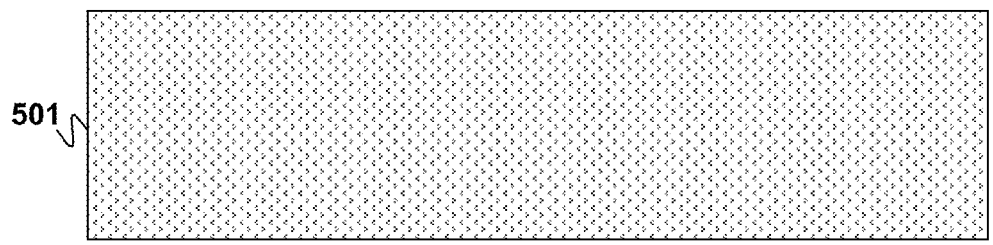
FIGS. 5A-5J are cross-sectional schematic diagrams illustrating a method for manufacturing an anode-shorted field stop insulated gate bipolar transistor (IGBT) according to another alternative embodiment of the present invention.
Figure 5B:
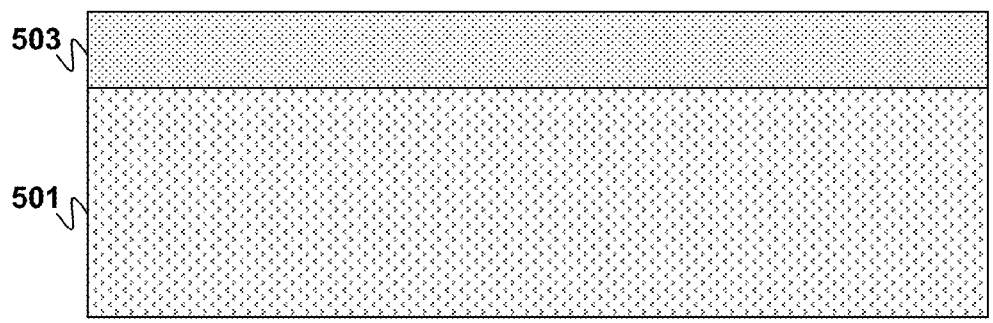

FIG. 5A-5J are cross-sectional schematic diagrams illustrating a method for manufacturing an anode-shorted field stop insulated gate bipolar transistor (IGBT) according to another alternative embodiment of the present invention. The fabrication method begins with a substrate 501 as shown in FIG. 5A. By way of example, and not by way of limitation, the substrate 501 may be an n+ type substrate. By way of example, and not by way of limitation, the substrate 501 may have a thickness of approximately 700 μm. A first epitaxial layer 503 of the same conductivity type as the substrate is formed on a top surface of the substrate 501 as shown in FIG. 5B. The first epitaxial layer 503 is a semiconducting material of the same conductivity type as the substrate 501 but with a lower concentration of charge carriers than the substrate. By way of example, and not by way of limitation, the first epitaxial layer 503 may be n− type doped if the substrate 501 is doped n+ type. Also by way of example and not by way of limitation, the first epitaxial layer may have a thickness of approximately 10 μm.

Figure 5C:
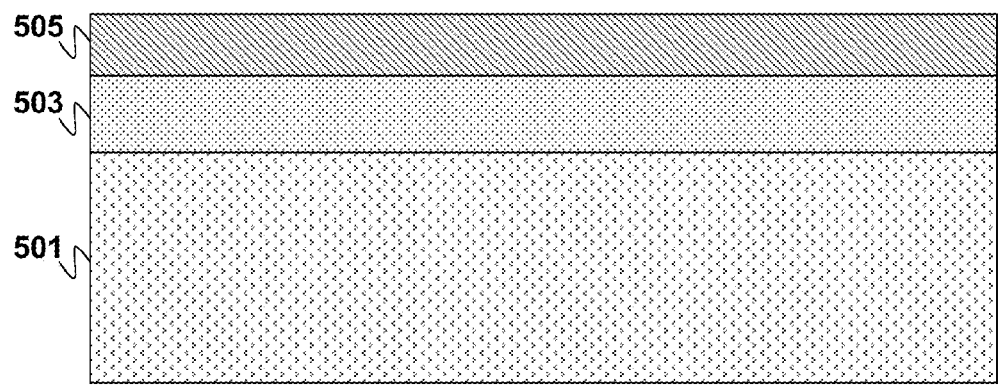
Figure 5D:
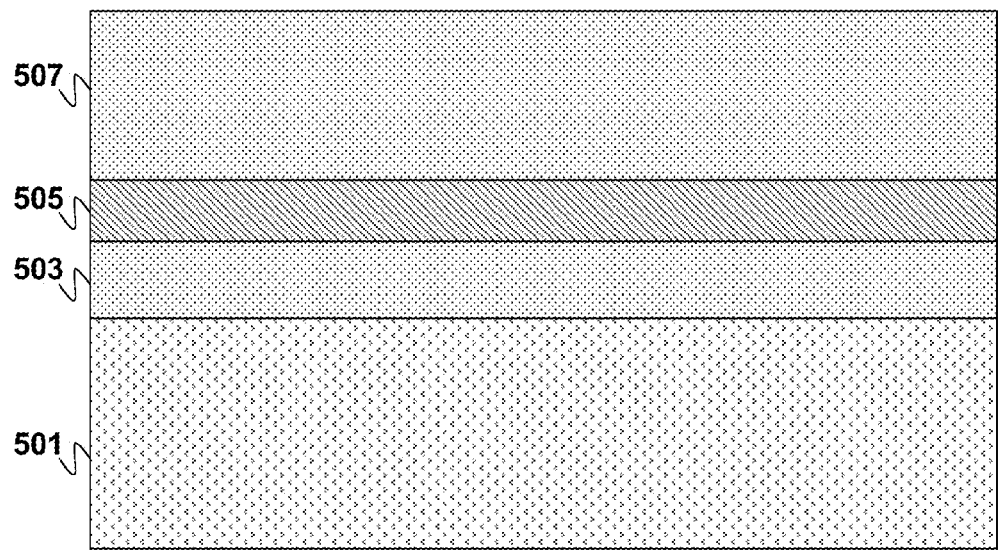

After the first epitaxial layer 503 is formed, a field stop layer 505 may be formed on top of the first epitaxial layer 503 as shown in FIG. 5C. The field stop layer 505 is a semiconducting layer of the same conductivity type as the substrate and first epitaxial layer. The field stop layer has a charge carrier concentration that is greater than that of the first epitaxial layer 503 and less than that of the substrate 501. By way of example, and not by way of limitation, the field stop layer 505 may be n type doped if the substrate 501 is n+ type doped and the first epitaxial layer 505 is n− type doped. Also by way of example and not by way of limitation, the field stop layer 505 may have a thickness of approximately 5 μm. A second epitaxial layer 507 of the same conductivity type as the substrate 501, first epitaxial layer 503, and field stop layer 505 is then grown on top of the field stop layer 505 as shown in FIG. 5D. The second epitaxial layer 507 is sometimes referred to herein as the voltage blocking layer 507. The second epitaxial layer 507 may have a lower charge carrier concentration than the substrate 501 and the field stop layer 505. Again, by way of example, and not by way of limitation, the voltage blocking layer 507 may be n− type doped if the substrate 501 is n+ type doped, the first epitaxial layer 503 is n− type doped, and the field stop layer 505 is n type doped. Also, by way of example, and not by way of limitation, the voltage blocking layer may be approximately 100 μm for a 1200V IGBT device or approximately 50 μm for a 600V device.

Figure 5E:
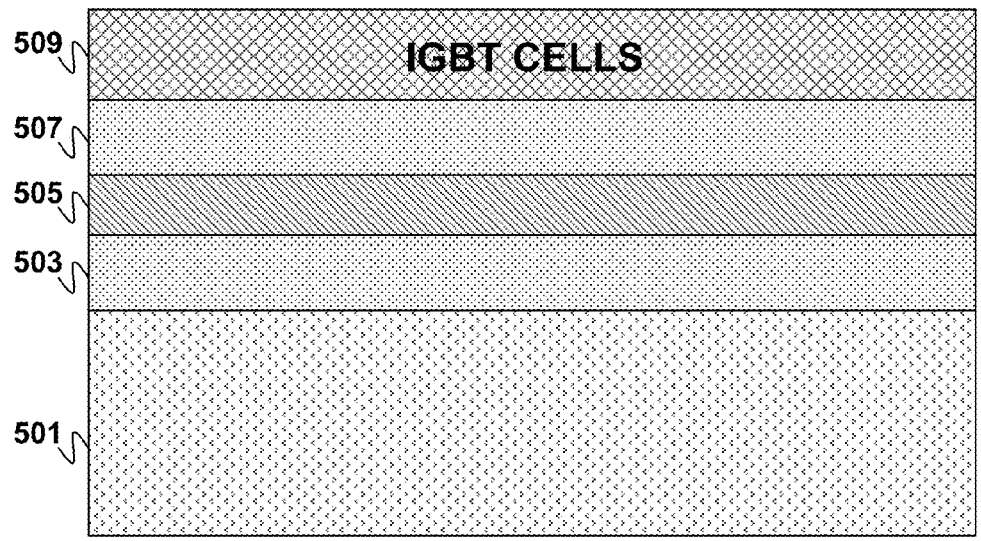
Figure 5F:
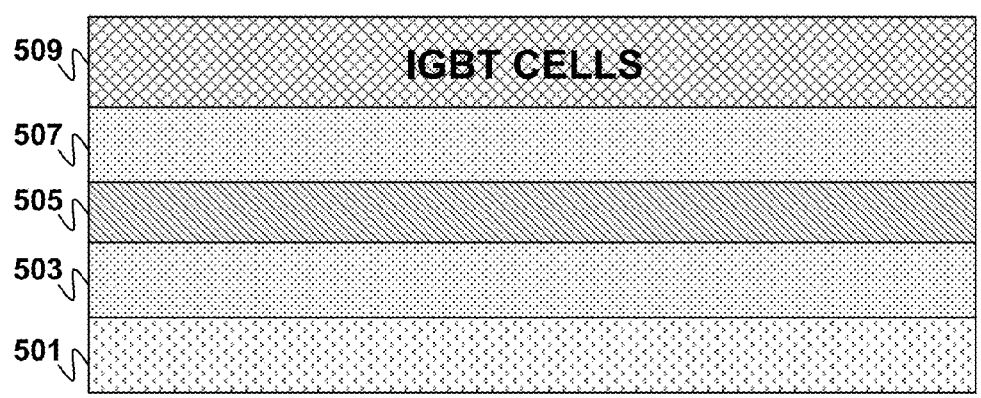

One or more IGBT component cells 509 may then be formed within a top surface of the voltage blocking layer 507 as shown in FIG. 5E. As noted above, the term "IGBT component cell" refers to a cell that includes a body region, one or more emitter regions, a gate electrode, one or more corresponding emitter electrodes, and insulating layers in any suitable/functional configuration. Following formation of the IGBT component cells 509 the substrate 501 is thinned to a desired thickness by removing material from a back side of the substrate as shown in FIG. 5F. The substrate 501 may be thinned, e.g., by grinding it from the back side. For certain applications, the desired thickness of the substrate 501 after grinding is approximately 5 μm.

Figure 5G:
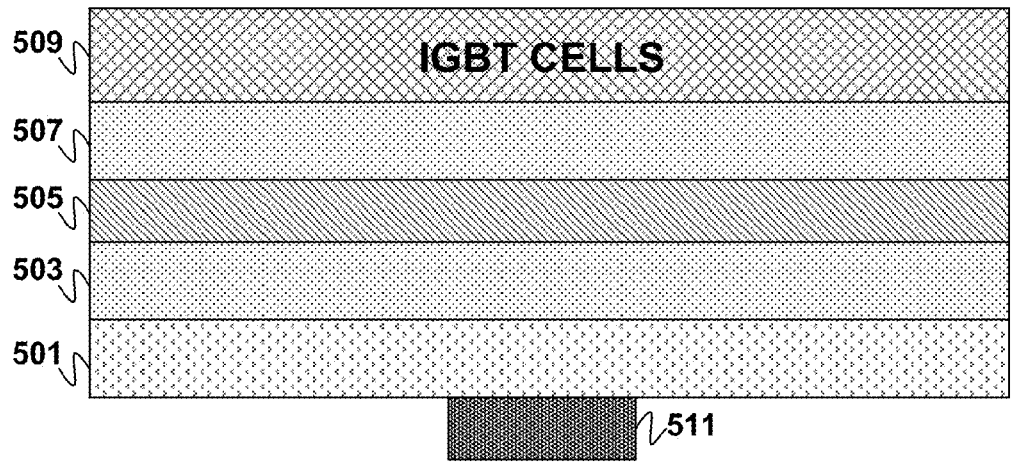
Figure 5H:
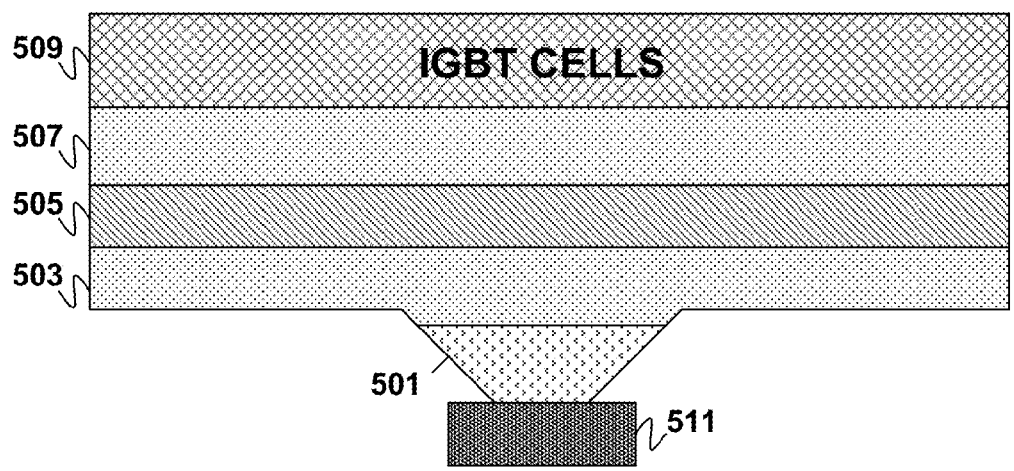

A masked metal deposition is then performed on the back surface of the substrate 501 to form a metal pattern 511 on the back surface of the substrate 501 as illustrated in FIG. 5G. The masked deposition may be implemented using a shadow mask, similar to the one discussed above. An anisotropic etch (e.g., a wet etch) may then be performed on the substrate 501 using the metal pattern 511 as a mask, so that one or more portions of the first epitaxial layer 503 are exposed, while leaving portions of the substrate 501 under the metal pattern as shown in FIG. 5H. For certain applications, the desired etch-depth may be approximately 10 μm, depending on the thickness of the substrate remaining after thinning.

Figure 5I:
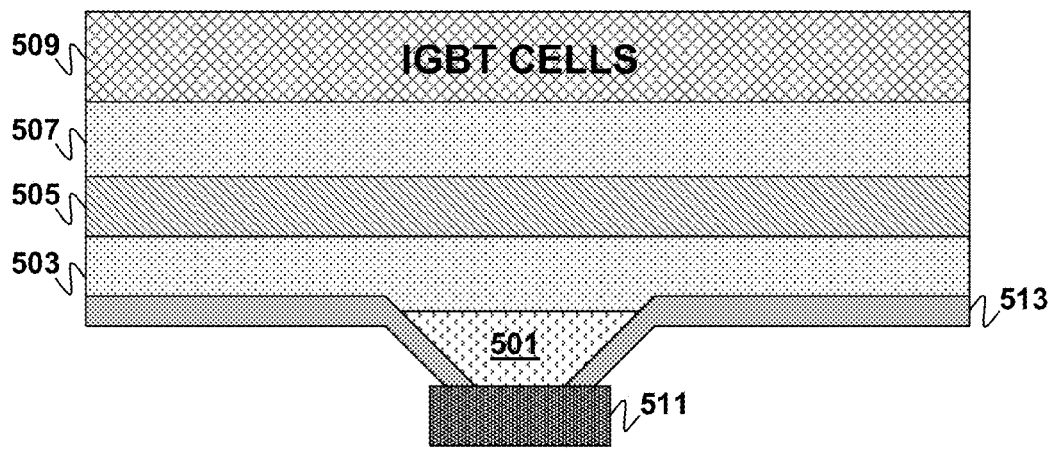
Figure 5J:
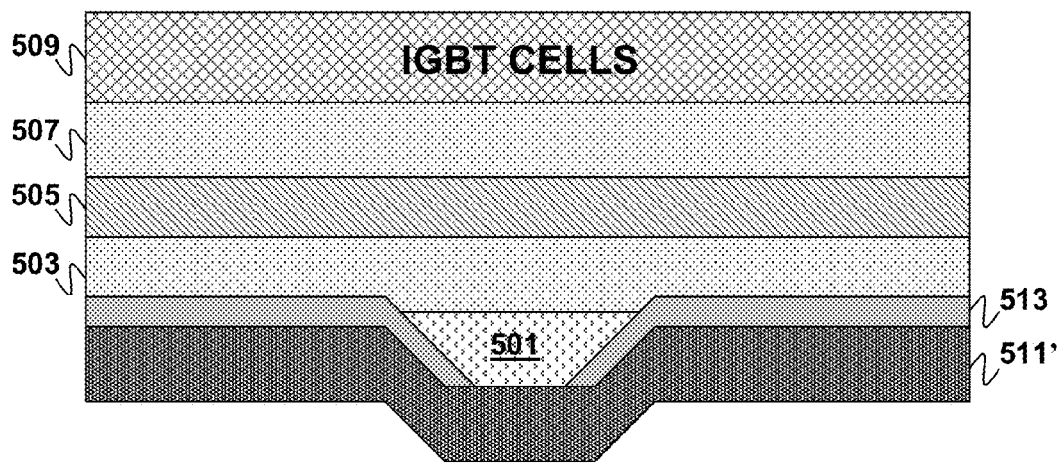

A backside blanket implant is then performed on the substrate 501 to implant dopants of an opposite conductivity type to that of the substrate 501, field stop layer 505, and epitaxial layer 503, 507 into exposed portions of the first epitaxial layer 503 and the substrate 501. The dopant implant forms implant regions 513 as shown in FIG. 5I. An annealing process may then be completed to activate the implant regions 513. By way of example and not by way of limitation, if the substrate 501, field stop layer 505, and epitaxial layers 503, 507 are doped n+, n, and n− type, respectively, the implant regions may be doped p+ type.

Lastly a metal layer 511' is deposited onto a back surface of the implant regions 513 and a back surface of the metal pattern 511 in order to form a collector electrode for the IGBT device. The resulting structure is an anode-shorted field stop IGBT, with alternating semiconductor regions of opposite conductivity type formed by the implant regions 513 and remaining portions of the substrate 501 forming the anode short circuit.

While the above is a complete description of the preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the items following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause as specified in 35 USC §112, ¶ 6.

What is claimed is:
1. A method for fabricating an anode-shorted field stop insulated gate bipolar transistor (IGBT), comprising:
 a) selectively forming first semiconductor regions of a first conductivity type within a top surface of a semi- conductor substrate, wherein the first conductivity type is opposite a conductivity type of the substrate;

b) growing a field stop layer of the first conductivity type onto the top surface of the substrate, wherein the field stop layer has a lower concentration of charge carriers than the first semiconductor regions;

c) growing an epitaxial layer of the first conductivity type on top of the field stop layer, wherein the epitaxial layer has a lower concentration of charge carriers than the field stop layer;

d) forming one or more insulated gate bipolar transistors (IGBT) component cells within the epitaxial layer;

e) thinning a back surface of the substrate to a desired thickness and expose the first semiconductor regions;

f) performing a blanket implant to form implant regions of a second conductivity type opposite that of the epitaxial layer and field stop layer within the back surface of the substrate, wherein is performed after the first semiconductor regions of a first conductivity type are formed on the top surface of the semiconductor substrate, wherein activation of the blanket implant is limited to minimal activation at less than 900° C.; and g) evaporating metal onto the back surface of the substrate.

2. The method of claim 1, wherein the substrate is a p-type substrate.

3. The method of claim 2, wherein the first semiconductor region is doped n+, the field stop layer is doped n and the epitaxial layer is doped n−.

4. The method of claim 3, wherein the implant regions are doped p+.

5. The method of claim 1, wherein forming the first semiconductor regions comprises performing a masked implant followed by diffusion.

6. The method of claim 5, wherein the first semiconductor regions are diffused at least 10 μm into the top surface of the substrate.

7. The method of claim 1, wherein the desired thickness in e) is 5 μm below the field stop layer.

8. The method of claim 1, wherein the blanket implant in f) is a Boron implant with a concentration of 1e16 performed at 40 keV.

9. The method of claim 1, wherein g) is performed at 450° C.

* * * * *